(12) United States Patent
Yeh et al.

(10) Patent No.: US 11,894,065 B2
(45) Date of Patent: Feb. 6, 2024

(54) THREE-DIMENSIONAL MEMORY DEVICE

(71) Applicant: MACRONIX International Co., Ltd., Hsinchu (TW)

(72) Inventors: Teng-Hao Yeh, Hsinchu County (TW); Hang-Ting Lue, Hsinchu (TW); Tzu-Hsuan Hsu, Chiayi County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 186 days.

(21) Appl. No.: 17/569,424

(22) Filed: Jan. 5, 2022

(65) Prior Publication Data

US 2023/0215502 A1 Jul. 6, 2023

(51) Int. Cl.
| | |
|---|---|
| *G11C 16/24* | (2006.01) |
| *G11C 16/10* | (2006.01) |
| *G11C 16/14* | (2006.01) |
| *G11C 16/16* | (2006.01) |
| *G11C 16/26* | (2006.01) |

(52) U.S. Cl.
CPC ............ *G11C 16/24* (2013.01); *G11C 16/10* (2013.01); *G11C 16/14* (2013.01); *G11C 16/16* (2013.01); *G11C 16/26* (2013.01)

(58) Field of Classification Search
CPC ......... G11C 16/24; G11C 16/10; G11C 16/14; G11C 16/16; G11C 16/26; G11C 5/066; G11C 7/1084; G11C 7/12; G11C 7/18; Y02D 10/00
USPC ....................................................... 365/207
See application file for complete search history.

(56) References Cited

U.S. PATENT DOCUMENTS

| | | | | |
|---|---|---|---|---|
| 6,671,204 | B2 | 12/2003 | Im | |
| 7,969,804 | B1 | 6/2011 | Hirose et al. | |
| 9,685,210 | B1* | 6/2017 | Ghosh | G11C 7/1075 |
| 11,011,234 | B1 | 5/2021 | Yeh et al. | |
| 11,488,676 | B2* | 11/2022 | Salahuddin | G06F 17/16 |
| 2006/0280022 | A1 | 12/2006 | Kono et al. | |
| 2015/0078100 | A1 | 3/2015 | Nakayama et al. | |
| 2017/0103813 | A1* | 4/2017 | Wang | H10B 41/35 |
| 2019/0371413 | A1* | 12/2019 | Okabe | G11C 16/24 |

FOREIGN PATENT DOCUMENTS

| | | | | |
|---|---|---|---|---|
| CN | 113222127 A | * | 8/2021 | ............ G06N 3/049 |
| EP | 3482395 | | 5/2019 | |
| TW | I578317 | | 4/2017 | |

OTHER PUBLICATIONS

"Search Report of Europe Counterpart Application", dated Jun. 30, 2022, p. 1-p. 8.

* cited by examiner

*Primary Examiner* — Fernando Hidalgo
(74) *Attorney, Agent, or Firm* — J.C. PATENTS

(57) ABSTRACT

A three-dimensional memory device, such as 3D AND Flash memory device, includes a first page buffer, a second page buffer, a sense amplifier, a first path selector, and a second path selector. The first page buffer and the second page buffer are respectively configured to temporarily store a first write-in data and a second write-in data. The first path selector couples the sense amplifier or the first page buffer to a first global bit line according to a first control signal. The second path selector couples the sense amplifier or the second page buffer to a second global bit line according to a second control signal.

16 Claims, 11 Drawing Sheets

THREE-DIMENSIONAL MEMORY DEVICE

BACKGROUND

Technical Field

The disclosure relates to a three-dimensional memory device. Particularly, the disclosure relates to a three-dimensional AND flash memory device.

Description of Related Art

In the technology of three-dimensional AND flash memory, a bandwidth of data read is generally limited by the total number of sense amplifiers. In the three-dimensional AND flash memory, since the sense amplifier requires a relatively large layout area and relatively high current consumption, the designer can only activate a limited number of sense amplifiers to control the instantaneous power consumption.

SUMMARY

The disclosure provides a three-dimensional memory device, having dual access paths to respectively perform data write and read operations.

A three-dimensional memory device of the disclosure includes a first page buffer, a second page buffer, a sense amplifier, a first path selector, and a second path selector. The first page buffer and the second page buffer are respectively configured to temporarily store a first write-in data and a second write-in data. The first path selector is coupled between a first global bit line, the sense amplifier, and the first page buffer. The first path selector couples the sense amplifier or the first page buffer to the first global bit line according to a first control signal. The second path selector is coupled between a second global bit line, the sense amplifier, and the second page buffer. The second path selector couples the sense amplifier or the second page buffer to the second global bit line according to a second control signal.

Based on the foregoing, the three-dimensional memory device of the disclosure provides dual access paths between the global bit lines, the sense amplifier, and the corresponding page buffers. The dual access paths respectively provide memory cells corresponding to the global bit lines to perform data write and data read operations. Accordingly, in the three-dimensional memory device, the data transmission path for the memory cells to perform the programming/erase operation and the data transmission path for performing the read operation can be separated, increasing the performance of the three-dimensional memory device. In addition, in the three-dimensional memory device of the disclosure, since the memory cells corresponding to different global bit lines may share the same sense amplifier, the circuit area can be effectively reduced, and the sensing current required at the same time can be reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
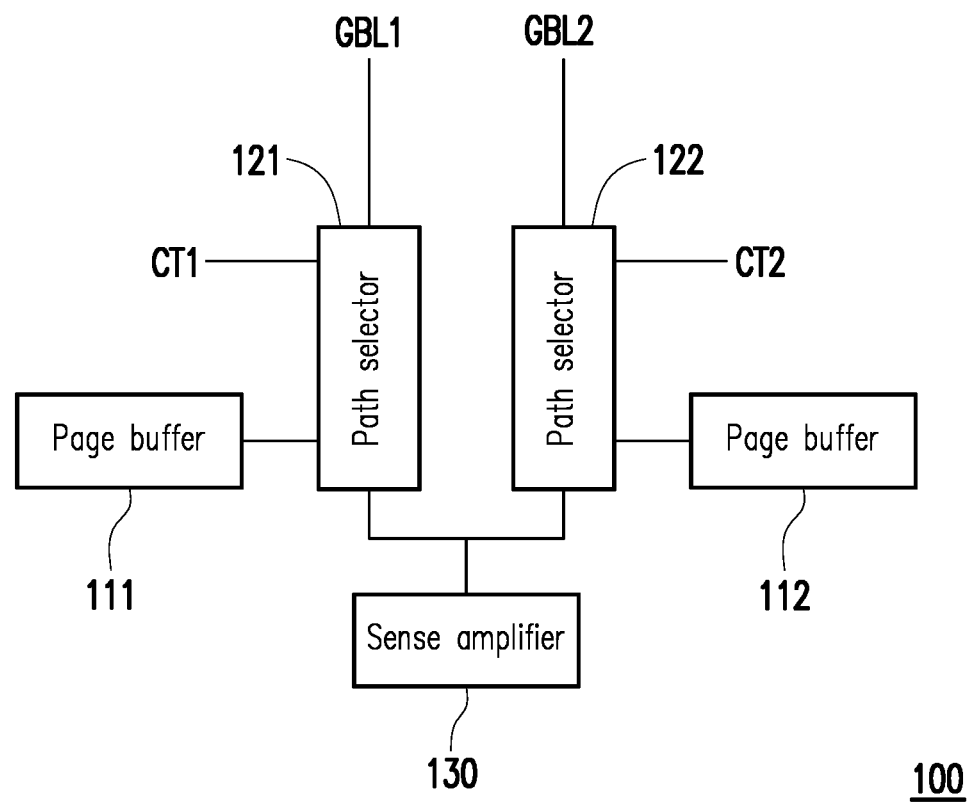
FIG. 1 is a schematic partial circuit block diagram of a three-dimensional memory device 100 according to an embodiment of the disclosure.

With reference to FIG. 1, FIG. 1 is a schematic partial circuit block diagram of a three-dimensional memory device 100 according to an embodiment of the disclosure. The three-dimensional memory device 100 includes page buffers 111, 112, path selectors 121, 122, and a sense amplifier 130. The page buffers 111, 112 are respectively configured to temporarily store a first write-in data and a second write-in data. The path selector 121 is coupled between a global bit line GBL1, the sense amplifier 130, and the page buffer 111. The path selector 121 couples the global bit line GBL1 to the page buffer 111 or couples the global bit line GBL1 to the sense amplifier 130 according to a control signal CT1. The path selector 122 is coupled between a global bit line GBL2, the sense amplifier 130, and the page buffer 112. The path selector 122 couples the global bit line GBL2 to the page buffer 112 or couples the global bit line GBL2 to the sense amplifier 130 according to a control signal CT2.

To be specific, when the three-dimensional memory device 100 works in a write mode, the path selector 121 may couple the global bit line GBL1 to the page buffer 111 according to the control signal CT1, and the path selector 122 may couple the global bit line GBL2 to the page buffer 112 according to the control signal CT2. Under this case, the page buffer 111 may send the first write-in data to a global word line GBL1 through the path selector 121, and perform a programming operation, a programming inhibiting operation, an erase operation, or an erase inhibiting operation on memory cells on the global word line GBL1. Comparatively, the page buffer 112 may send the second write-in data to a global word line GBL2 through the path selector 122, and perform a programming operation, a programming inhibiting operation, an erase operation, or an erase inhibiting operation on memory cells on the global word line GBL2.

To further describe, when the three-dimensional memory device 100 works in the write mode and performs a programming operation, a selected memory cell on the global word line GBL1 is a programmed memory cell. An inhibited memory cell on the global word lines GBL2 and the above selected memory cell share the same word line, and requires to perform a programming inhibiting operation. Under this case, the first data provided by the page buffer 111 may be a programming voltage, and the second data provided by the page buffer 112 may be a programming inhibiting voltage, causing the selected memory cell on the global word line GBL1 to perform the programming operation through Fowler-Nordheim (FN) tunneling, and causing the inhibited memory cell on the global word line GBL2 to perform the programming inhibiting operation.

Moreover, when the three-dimensional memory device 100 works in the write mode and performs a sector erase operation, the first write-in data and the second write-in data respectively provided by the page buffers 111 and 112 may be erase voltages, and may be configured to perform erase operations on a plurality of selected memory cells corresponding to the global bit line GBL1 and the global bit line GBL2.

Furthermore, when the three-dimensional memory device 100 works in the write mode and performs a byte erase operation, the first write-in data provided by the page buffer 111 may be an erase inhibiting voltage, and may be configured to perform an erase inhibiting operation on an inhibited memory cell corresponding to the global bit line GBL1. The second write-in data provided by the page buffer 112 may be an erase voltage, and may be configured to perform an erase operation on the selected memory cell corresponding to the global bit line GBL2. In this embodiment, the inhibited memory cell and the selected memory cell may share the same word line.

When the three-dimensional memory device 100 works in a read mode, the path selector 121 may couple the global bit line GBL1 to the sense amplifier 130 according to the control signal CT1, and the path selector 122 may couple the global bit line GBL2 similarly to the sense amplifier 130 according to the control signal CT2. Here, the sense amplifier 130 may time-divisionally sense data on the global bit lines GBL1 and GBL2 to generate a plurality of read-out data.

In this embodiment, the sense amplifier 130 may time-divisionally compare the global bit lines GBL1 and GBL2 with a reference signal and generate a plurality of read-out data.

As can be known from the above description, the three-dimensional memory device 100 of the disclosure provides a plurality of access paths, so that when the memory device 100 performs the write or read operations, the global bit lines GBL1 and GBL2 are coupled to the page buffers 111, 112 or to the sense amplifier 130 through the path selectors 121, 122, and the corresponding write or read operations are performed. Moreover, since different memory cell blocks corresponding to the global bit lines GBL1 and GBL2 may share the same sense amplifier 130, the circuit area can be reduced, and the power consumption required at the same time by the data read operation can be reduced.

Figure 2:
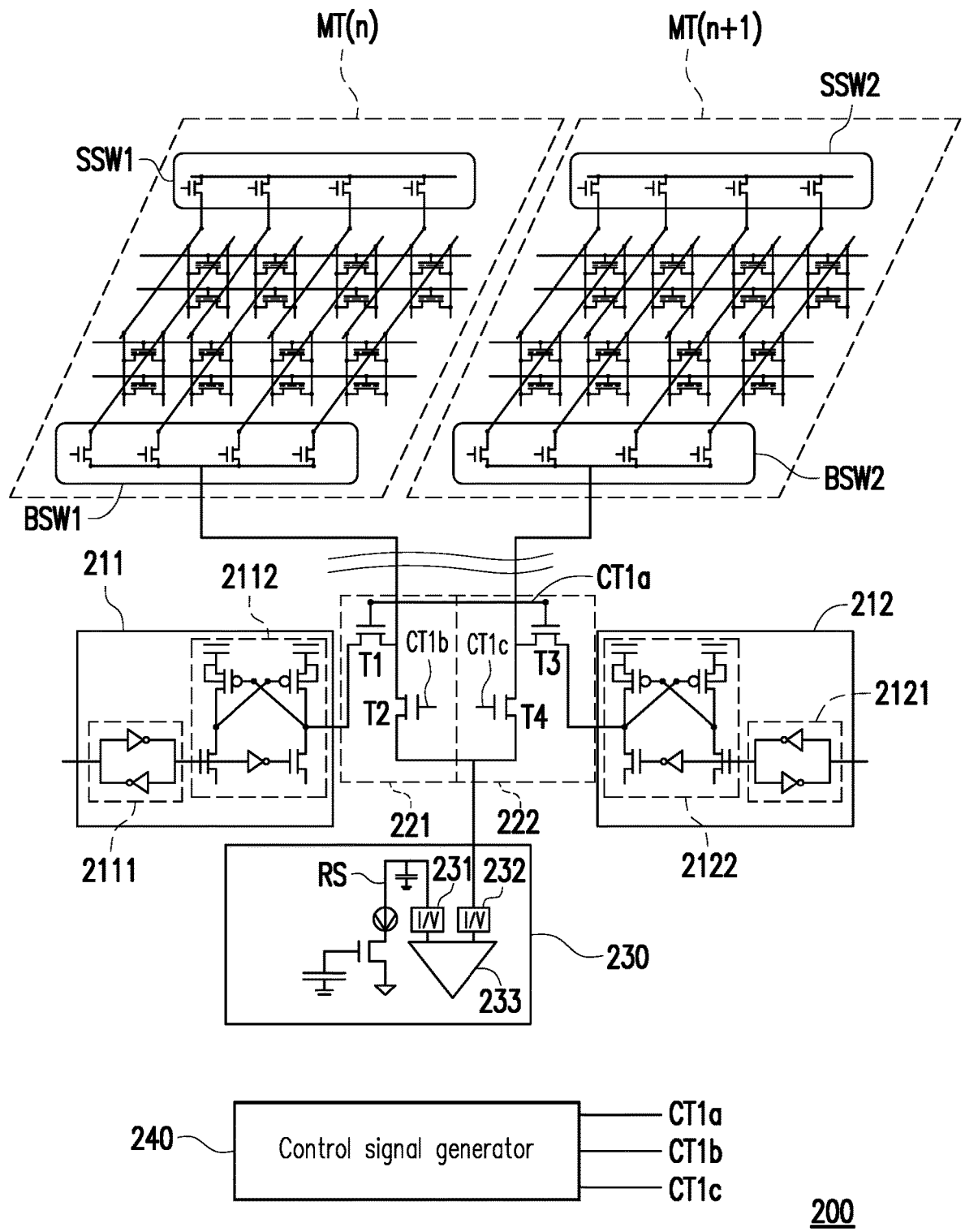
FIG. 2 is a schematic diagram of a three-dimensional memory device according to another embodiment of the disclosure.

Next, with reference to FIG. 2, FIG. 2 is a schematic diagram of a three-dimensional memory device according to another embodiment of the disclosure. A three-dimensional memory device 200 includes memory cell blocks MT(n), MT(n+1), page buffers 211, 212, path selectors 221, 222, a sense amplifier 230, and a control signal generator 240. The memory cell block MT(n) has a source line switch area SSW1 and a bit line switch area BSW1. The source line switch area SSW1 has a plurality of source line switches to receive a source line voltage. The bit line switch area BSW1 has a plurality of bit line switches, and the bit line switches are commonly coupled to a global bit line GBL(n). The memory cell block MT (n+1) has a source line switch area SSW2 and a bit line switch area BSW2. The source line switch area SSW2 has a plurality of source line switches to receive the source line voltage. The bit line switch area BSW2 has a plurality of bit line switches, and the bit line switches are commonly coupled to a global bit line GBL (n+1). Each of the memory cell blocks MT(n) and MT(n+1) have a three-dimensional AND flash memory cell array.

The path selectors 221 and 222 are respectively coupled to the global bit line GBL(n) and the global bit line GBL(n+1). The path selector 221 is coupled to the page buffer 211 and the sense amplifier 230. In addition, the path selector 222 is coupled to the page buffer 212 and the sense amplifier 230. The path selector 221 includes two switches respectively constructed by transistors T1 and T2. The path selector 222 includes two switches respectively constructed by transistors T3 and T4. The transistor T1 is coupled between the global bit line GBL(n) and the page buffer 211. The transistor T2 is coupled between the global bit line GBL(n) and the sense amplifier 230. The transistor T3 is coupled between the global bit line GBL(n+1) and the page buffer 212. Moreover, the transistor T4 is coupled between the global bit line GBL(n+1) and the sense amplifier 230. The transistors T1 and T3 are controlled by a same control signal CT1a. The transistors T2 and T4 are respectively controlled by control signals CT1b and CT1c. In a write mode, the transistors T1 and T3 may be turned on, and the transistors T2 and T4 may be turned off. In a read mode, the transistors T1 and T3 may be turned off, and the transistors T2 and T4 may be turned on.

In this embodiment, the control signals CT1a, CT1b may be a first group of control signals, and the control signals CT1a, CT1c may be a second group of control signals.

The page buffer 211 includes a latch 2111 and a level shifter 2112. The latch 2111 and the level shifter 2112 are coupled to each other. The latch 2111 is configured to latch a buffer data. The level shifter 2112 is configured to shift a voltage of the buffer data to generate a first write-in data, and transmit the first write-in data through the path selector 221 to the global bit line GBL(n). The page buffer 212 includes a latch 2121 and a level shifter 2122. The latch 2121 and the level shifter 2122 are coupled to each other. The latch 2121 is configured to latch another buffer data. The level shifter 2122 is configured to shift a voltage of the another buffer data to generate a second write-in data, and transmit the second write-in data through the path selector 222 to the global bit line GBL(n+1).

It is worth mentioning that the circuit structures of the latches 2111, 2121 and the level shifters 2112, 2122 shown in FIG. 2 are only exemplary examples and are not intended to limit the scope of the disclosure. Any latch circuits and voltage shift circuits familiar to those ordinarily skilled in the art may be employed to respectively implement the latches 2111, 2121 and the level shifters 2112, 2122 of the disclosure, which is not particularly limited.

In addition, the sense amplifier 230 is coupled to the path selectors 221 and 222. In this embodiment, the sense amplifier 230 includes current voltage transducers (I/V) 231, 232 and an amplifying circuit 233. The current voltage transducer (I/V) 232 may convert a current signal provided by the path selector 221 or the path selector 222 into a voltage signal. The current voltage transducer (I/V) 231 may be configured to provide a reference signal RS. The amplifying circuit 233 is configured to sense the voltage signal provided by the current voltage transducer (I/V) 231 according to the reference signal RS to generate read-out data.

The control signal generator 240 is coupled to the path selectors 221 and 222. The control signal generator 240 may generate the control signals CT1a, CT1b, and CT1c according to the operation modes of the three-dimensional memory device 200.

Incidentally, when a read operation is performed one by one on memory cells of the memory cell block MT(n), the bit line switches in the bit line switch area BSW1 and the source line switches in the source line switch area SSW1 may be sequentially turned on one by one, and the read operation on each memory cell in the memory cell block MT(n) can be simply completed.

Figure 3A:
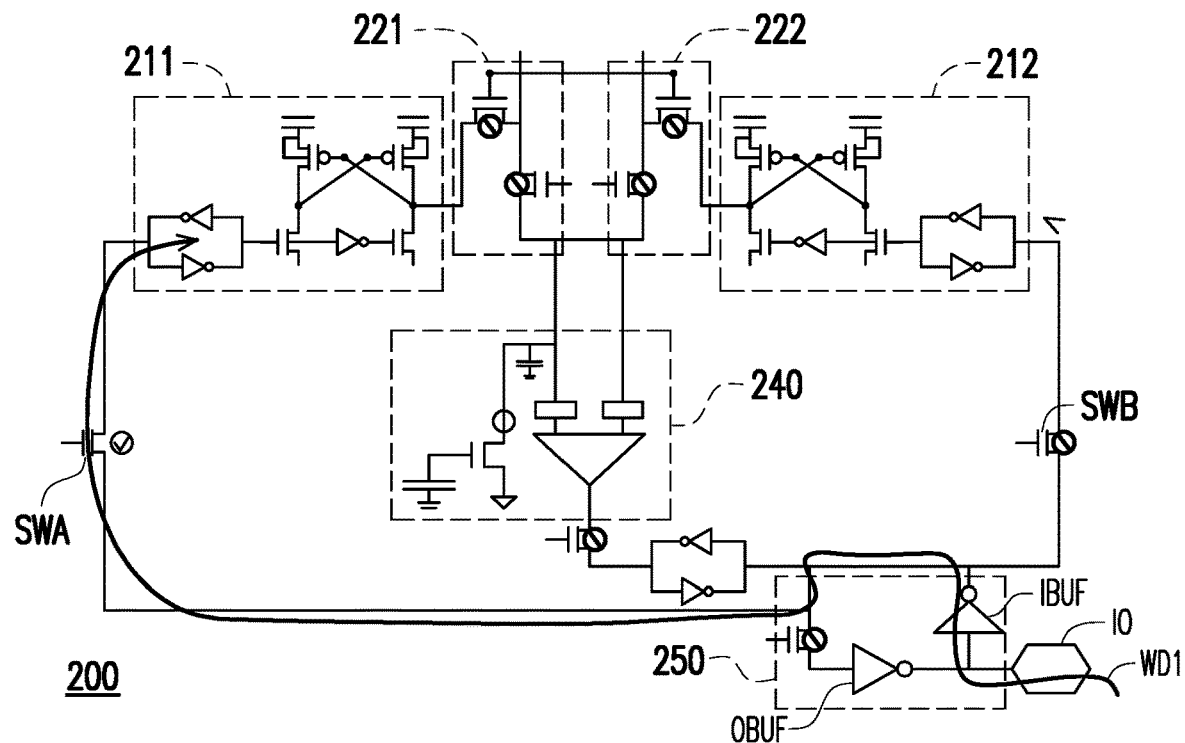
FIG. 3A and FIG. 3B are schematic diagrams of a write operation for data write by page buffers of a three-dimensional memory device according to an embodiment of the disclosure.
Figure 3B:
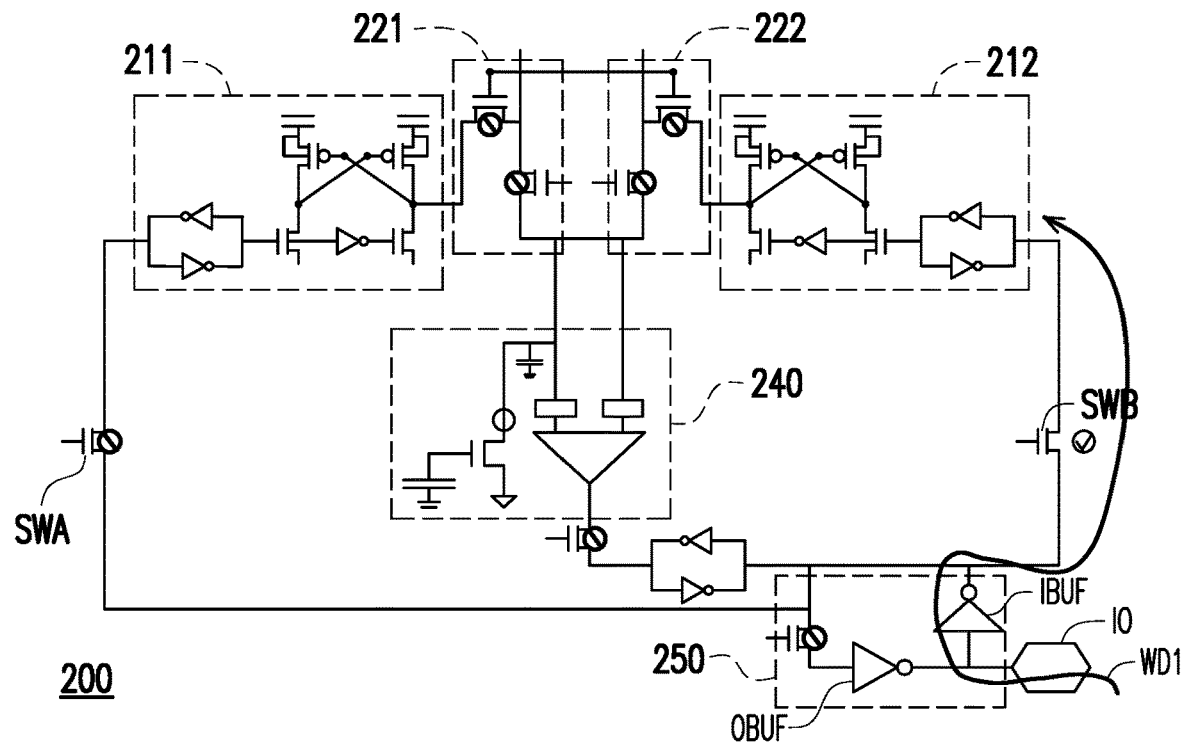

Next, with reference to FIG. 3A and FIG. 3B, FIG. 3A and FIG. 3B are schematic diagrams of a write operation for data write by page buffers of a three-dimensional memory device according to an embodiment of the disclosure. The circuit architecture of the three-dimensional memory device 200 of FIG. 2 is taken as an example. In this embodiment, the three-dimensional memory device 200 additionally includes an input and output circuit 250. The input and output circuit 250 includes an input buffer IBUF and an output buffer OBUF. The input buffer IBUF and the output buffer OBUF are coupled to an input and output port IO, and are coupled to the page buffers 211 and 212 respectively through switches SWA and SWB.

In FIG. 3A, when a write operation is performed on a first write-in data into the page buffer 211, the switch SWA is turned on and the switch SWB is turned off. The input and output circuit 250 receives a first write-in data WD1 through the input and output port IO. Moreover, the input buffer IBUF receives the first write-in data WD1, and writes the first write-in data WD1 into the page buffer 211 through the switch SWA.

At this time, all switches (transistors) in the path selectors 221 and 222 are in a turned-off state, and the sense amplifier 230 may be non-activated to save power consumption.

In FIG. 3B, when a write operation is performed on a second write-in data into the page buffer 212, the switch SWB is turned on and the switch SWA is turned off. The input and output circuit 250 receives a second write-in data WD2 through the input and output port IO. In addition, the input buffer IBUF receives the second write-in data WD2, and writes the second write-in data WD2 into the page buffer 212 through the switch SWB. Similar to FIG. 3A, at this time, all switches (transistors) in the path selectors 221 and 222 are in a turned-off state, and the sense amplifier 230 may be non-activated to save power consumption.

Figure 4A:
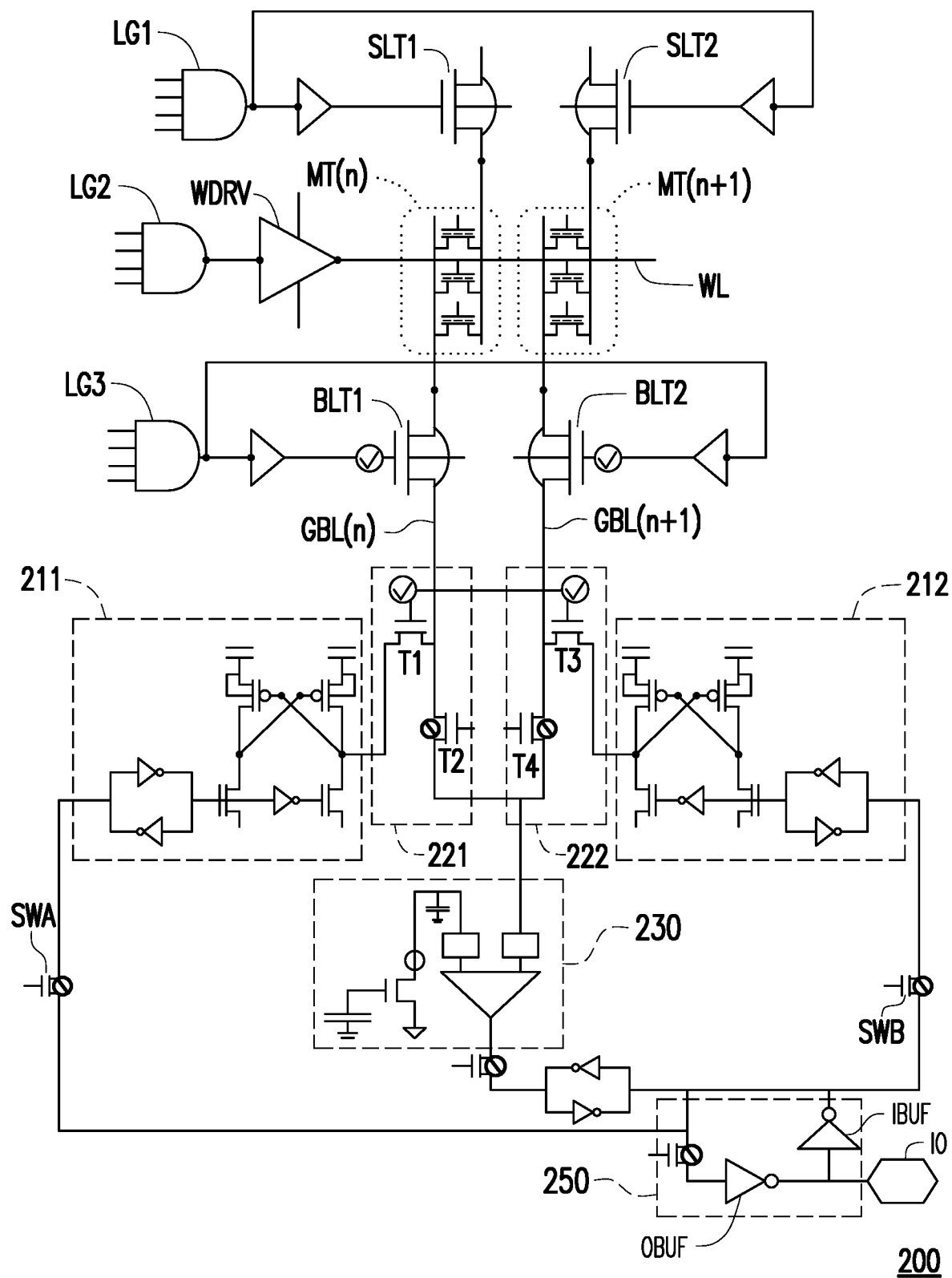
FIG. 4A and FIG. 4B are schematic diagrams of a programming operation of a three-dimensional memory device according to an embodiment of the disclosure.
Figure 4B:
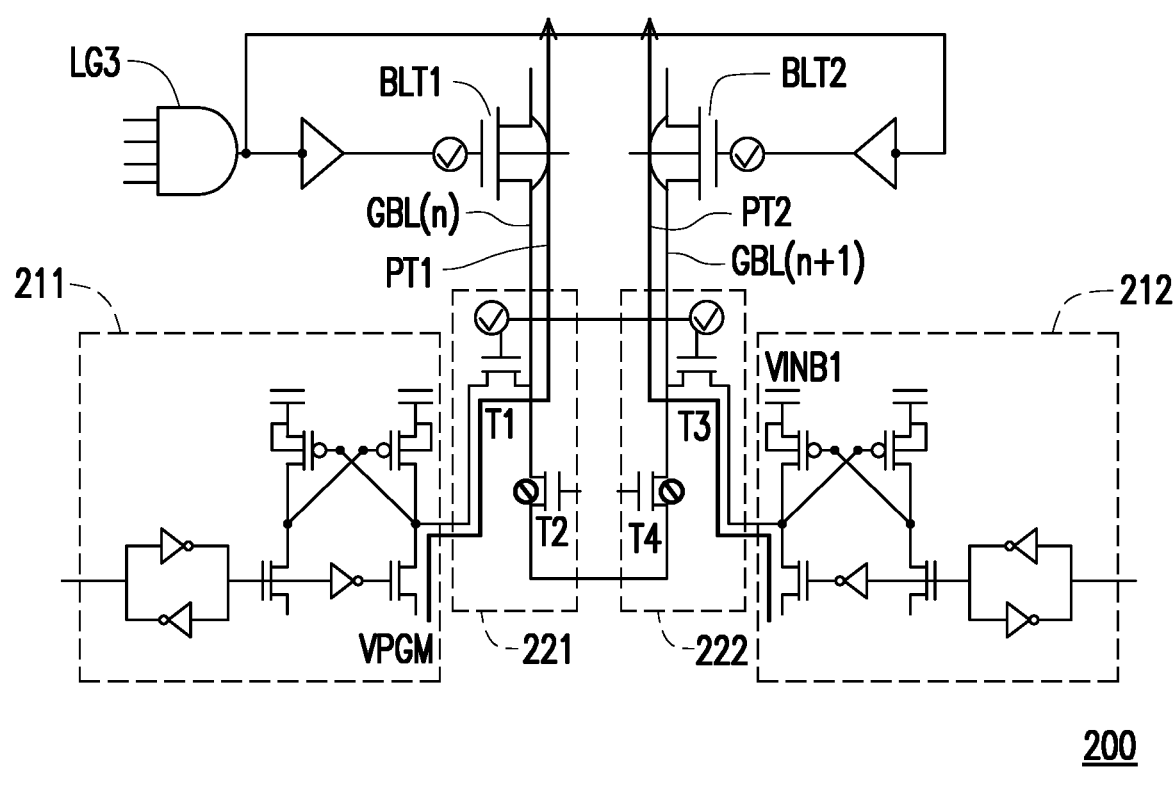

Next, with reference to FIG. 4A and FIG. 4B, FIG. 4A and FIG. 4B are schematic diagrams of a programming operation of a three-dimensional memory device according to an embodiment of the disclosure. Similarly, the circuit architecture of the three-dimensional memory device 200 of FIG. 2 is taken as an example. In FIG. 4A, the memory cell blocks MT(n) and MT(n+1) may share a word line WL. The memory cell blocks MT(n) and MT(n+1) respectively correspond to different source line switches SLT1, SLT2 and to different bit line switches BLT1, BLT2. Logic circuits LG1, LG3 respectively generate control signals for controlling the source line switches SLT1, SLT2 and the bit line switches BLT1, BLT2. A logic circuit LG2 works with a word line driver WDRV to drive the word line WL.

For performing a programming operation, a case where the memory cell in the memory cell block MT(n) is selected to perform the programming operation, and the memory cell in the memory cell block MT(n+1) performs programming inhibiting is taken as an example. At this time, the switches SWA, SWB are both turned off, and the input and output circuit 250 and the sense amplifier 230 may both be non-activated to save power consumption.

In addition, the bit line switches BLT1, BLT2 corresponding to the selected memory cell and the inhibited memory cell are each turned on, and the source line switches SLT1, SLT2 corresponding to the selected memory cell and the inhibited memory cell may be turned off.

It is worth noting that, in the path selector 221, the transistor T1 is turned on, and the transistor T2 is turned off. In addition, in the path selector 222, the transistor T3 is turned on, and the transistor T4 is turned off. Accordingly, the page buffer 211 may be coupled to the global bit line GBL(n) through the transistor T1, and the page buffer 212 may be coupled to the global bit line GBL(n) through the transistor T3. The global bit line GBL(n) and the sense amplifier 230 are electrically isolated.

Then, with reference to FIG. 4B, a case where the buffer data stored in the page buffer 211 is logic 0 and the buffer data stored in the page buffer 212 is logic 1 is taken as an example. The page buffer 211 together with the turned-on transistor T1 and the bit line switch BLT1 may form a first transmission path PT1. Also, by using the first transmission path PT1, the page buffer 211 may transmit a first data at a programming voltage VPGM to the selected memory cell in the memory cell block MT(n), and perform a programming operation on the selected memory cell. In addition, the page buffer 212 together with the turned-on transistor T3 and the bit line switch BLT2 may form a second transmission path PT2. Also, by using the second transmission path PT2, the page buffer 212 may transmit a second data at a programming inhibiting voltage VINB1 to the inhibited memory cell in the memory cell block MT(n+1), and perform a programming inhibiting operation on the inhibited memory cell.

In this embodiment, the programming inhibiting voltage VINB1 may be, for example, 1 to 1.3 volts, and the programming voltage VPGM may be, for example, −9.5 volts.

It is worth mentioning that in FIG. 4A, the bit line switches BLT1, BLT2, the source line switches SLT1, SLT2, the page buffers 211, 212, and the path selectors 221, 222 may each include a transistor having a triple well substrate, and may thereby provide a positive or negative voltage.

Figure 5A:
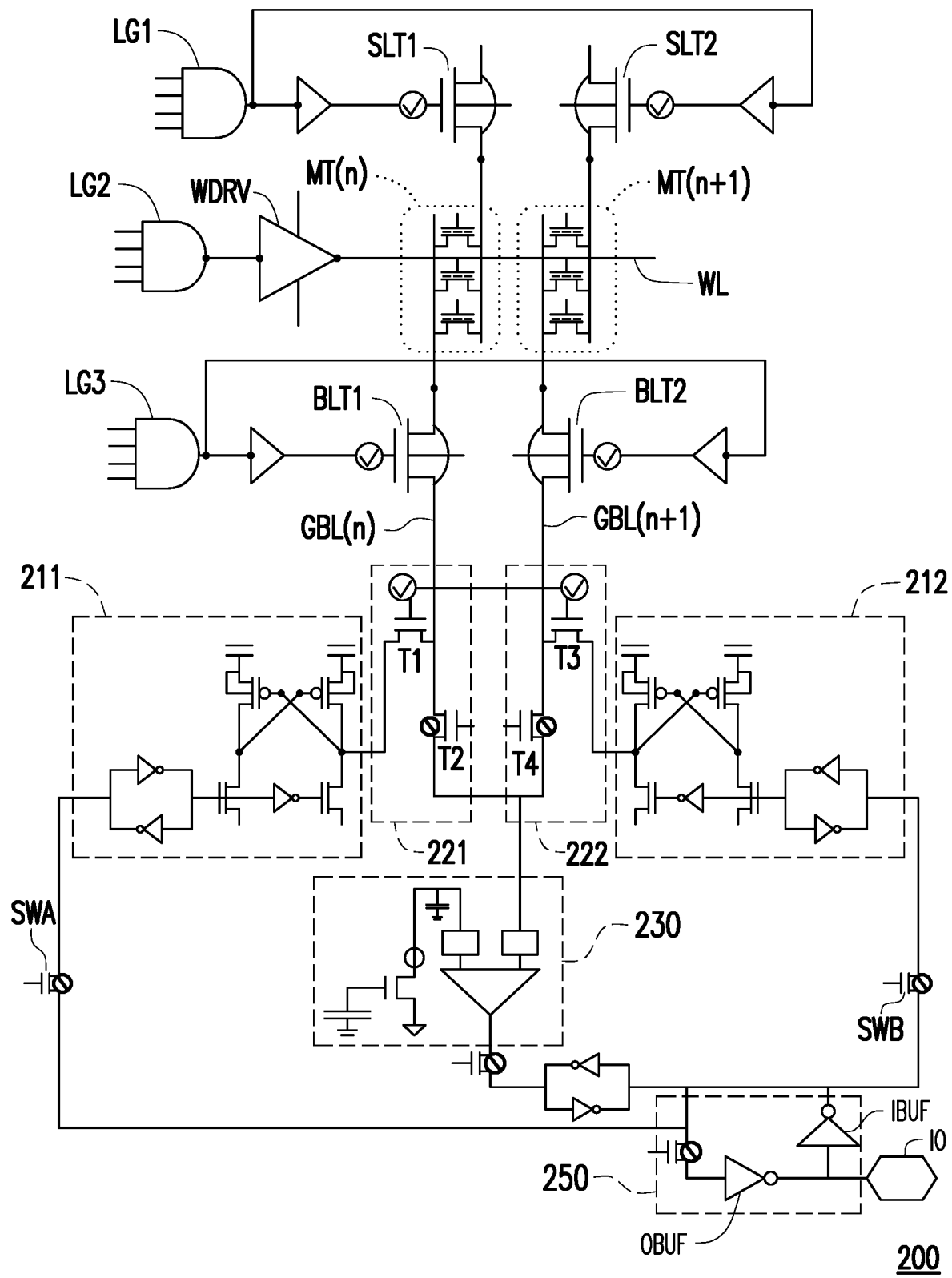
FIG. 5A and FIG. 5B are schematic diagrams of a sector erase operation of a three-dimensional memory device according to an embodiment of the disclosure.
Figure 5B:
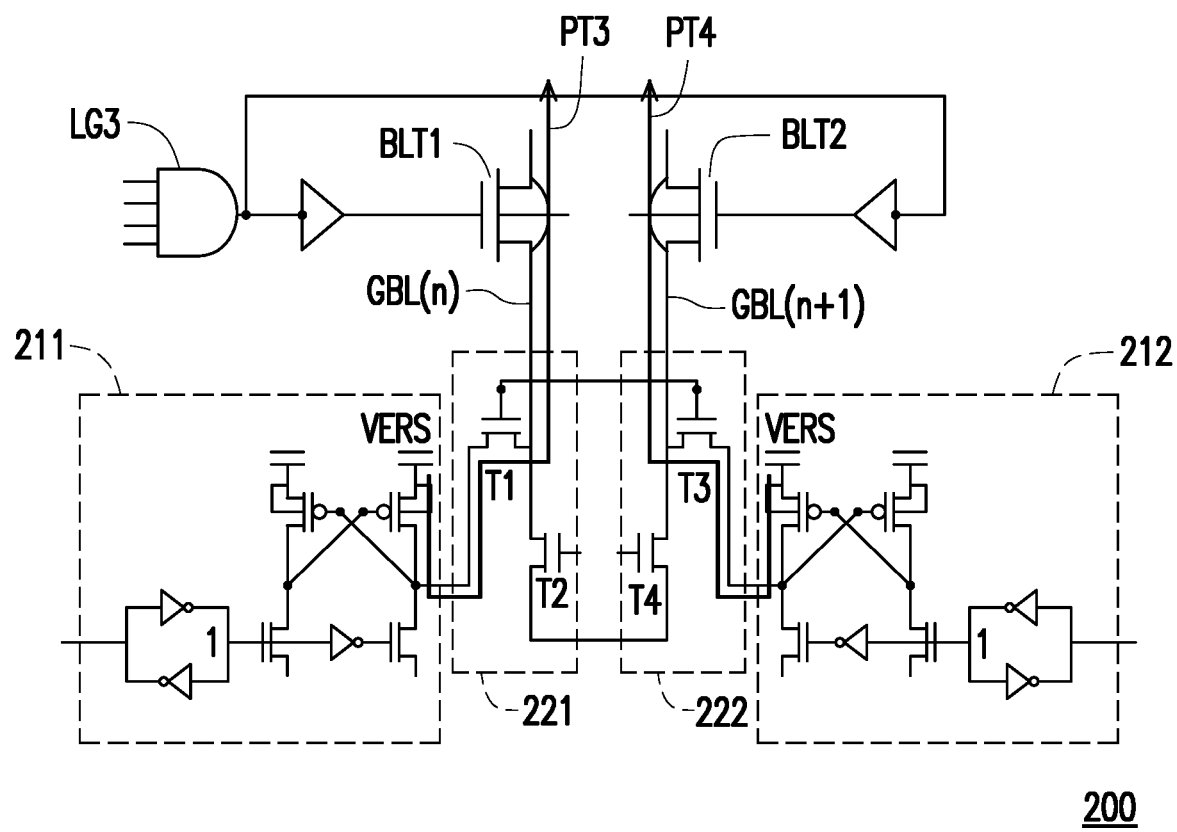

Next, with reference to FIG. 5A and FIG. 5B, FIG. 5A and FIG. 5B are schematic diagrams of a sector erase operation of a three-dimensional memory device according to an embodiment of the disclosure. Similarly, the circuit architecture of the three-dimensional memory device 200 of FIG. 2 is taken as an example. In FIG. 5A, the memory cell blocks MT(n) and MT(n+1) may share the word line WL. The memory cell blocks MT(n) and MT(n+1) respectively correspond to different source line switches SLT1, SLT2 and to different bit line switches BLT1, BLT2. The logic circuits LG1, LG3 respectively generate control signals for controlling the source line switches SLT1, SLT2 and the bit line switches BLT1, BLT2. The logic circuit LG2 works with the word line driver WDRV to drive the word line WL.

When a sector erase operation is performed, the memory cell blocks MT(n) and MT(n+1) may be erased at the same time. At this time, the switches SWA, SWB are both turned off, and the input and output circuit 250 and the sense amplifier 230 may both be non-activated to save power consumption. In addition, the bit line switches BLT1, BLT2 may be turned on, and the source line switches SLT1, SLT2 may also be turned on. Moreover, in the path selector 221, the transistor T1 is turned on, and the transistor T2 is turned off. In the path selector 222, the transistor T3 is turned on, and the transistor T4 is turned off. The page buffer 221 is coupled to the global bit line GBL(n) through the transistor T1. The page buffer 222 is coupled to the global bit line GBL(n+1) through the transistor T3. The global bit lines GBL(n), GBL(n+1) are electrically isolated from the sense amplifier.

Then, with reference to FIG. 5B, a case where the buffer data stored in the page buffers 211, 212 is logic 1 is taken as an example. The page buffer 211 together with the turned-on transistor T1 and the bit line switch BLT1 may form a third transmission path PT3. Also, by using the third transmission path PT3, the page buffer 211 may transmit a first data at an erase voltage VERS to memory cells in the memory cell block MT(n), and perform an erase operation on a plurality of selected memory cells in the memory cell block MT(n). In addition, the page buffer 212 together with the turned-on transistor T3 and the bit line switch BLT2 may form a fourth transmission path PT4. Also, by using the fourth transmission path PT4, the page buffer 212 may transmit a second data at the erase voltage VERS to a plurality of selected memory cells in the memory cell block MT(n+1), and perform an erase operation on the selected memory cells.

In this embodiment, the erase voltage VERS may be 5 to 10 volts.

Figure 6A:
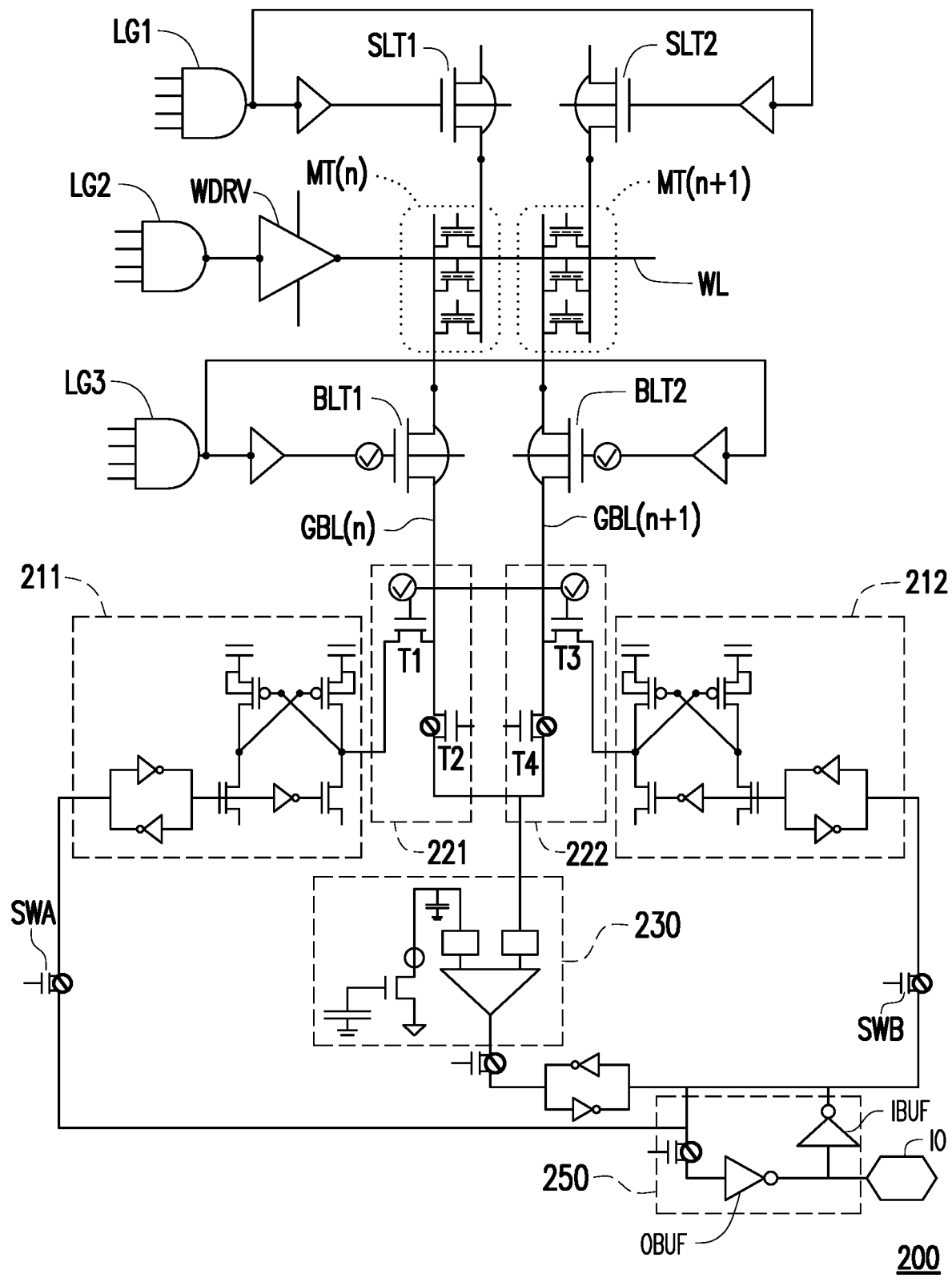
FIG. 6A and FIG. 6B are schematic diagrams of a sector erase operation of a three-dimensional memory device according to an embodiment of the disclosure.
Figure 6B:
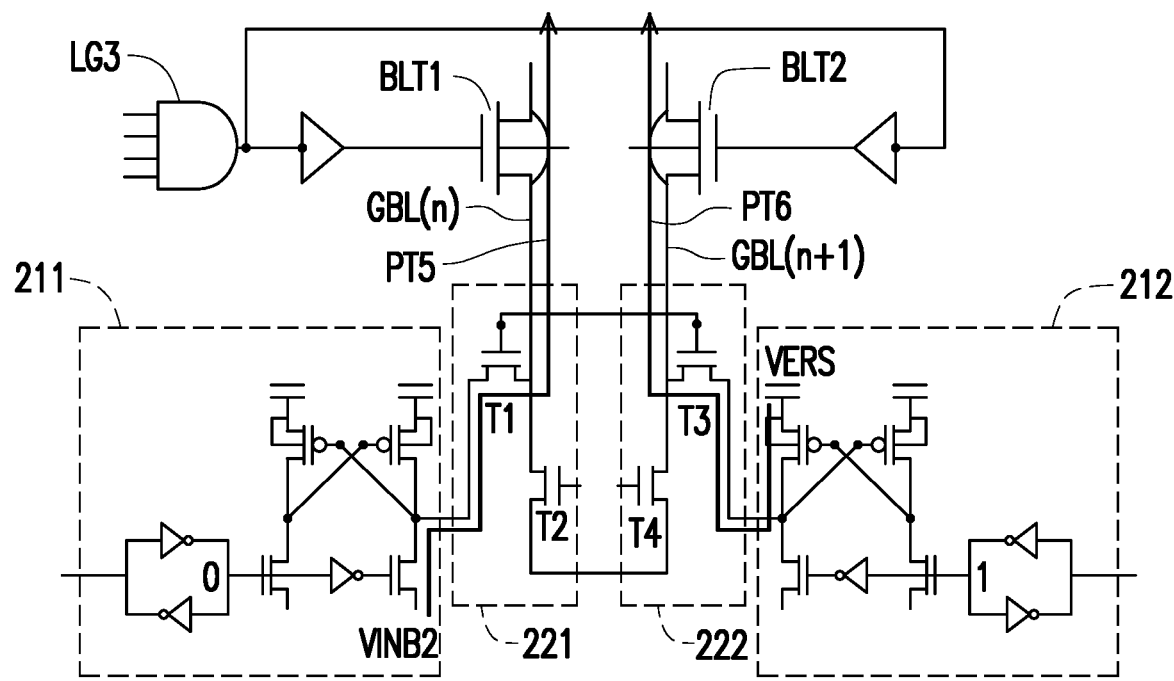

Next, with reference to FIG. 6A and FIG. 6B, FIG. 6A and FIG. 6B are schematic diagrams of a byte erase operation of a three-dimensional memory device according to an embodiment of the disclosure. Similarly, the circuit architecture of the three-dimensional memory device 200 of FIG. 2 is taken as an example. In FIG. 6A, the memory cell blocks MT(n) and MT(n+1) may share the word line WL. The memory cell blocks MT(n) and MT(n+1) respectively correspond to different source line switches SLT1, SLT2 and to different bit line switches BLT1, BLT2. The logic circuits LG1, LG3 respectively generate control signals for controlling the source line switches SLT1, SLT2 and the bit line switches BLT1, BLT2. The logic circuit LG2 works with the word line driver WDRV to drive the word line WL.

When a byte erase operation is performed, selected memory cells in the memory cell block MT(n+1) are erased, and inhibited memory cells in the memory cell block MT(n+1) require to perform an erase inhibiting operation. The selected memory cells and the inhibited memory cells correspond to the same word line. At this time, the switches SWA, SWB are both turned off, and the input and output circuit 250 and the sense amplifier 230 may both be non-activated to save power consumption. In addition, the bit line switches BLT1, BLT2 may be turned on, and the source line switches SLT1, SLT2 may be turned off. Moreover, in the path selector 221, the transistor T1 is turned on, and the transistor T2 is turned off. In the path selector 222, the transistor T3 is turned on, and the transistor T4 is turned off. The page buffer 221 is coupled to the global bit line GBL(n) through the transistor T1. The page buffer 222 is coupled to the global bit line GBL(n+1) through the transistor T3. The global bit lines GBL(n), GBL(n+1) are electrically isolated from the sense amplifier.

Then, with reference to FIG. 6B, a case where the buffer data stored in the page buffer 211, 212 are respectively logic 0 and 1 is taken as an example. The page buffer 211 together with the turned-on transistor T1 and the bit line switch BLT1 may form a fifth transmission path PT5. Also, by using the fifth transmission path PT5, the page buffer 211 may transmit a first data at an erase inhibiting voltage VINB2 to memory cells in the memory cell block MT(n), and perform an erase inhibiting operation on inhibited memory cells in the memory cell block MT(n). In addition, the page buffer 212 together with the turned-on transistor T3 and the bit line switch BLT2 may form a sixth transmission path PT6. Also, by using the sixth transmission path PT6, the page buffer 212 may transmit a second data at the erase voltage VERS to selected memory cells in the memory cell block MT(n+1), and perform an erase operation on the selected memory cells. The erase inhibiting voltage VINB2 is, for example, −4 volts, and the erase voltage VERS is, for example, 5 to 10 volts.

Figure 7A:
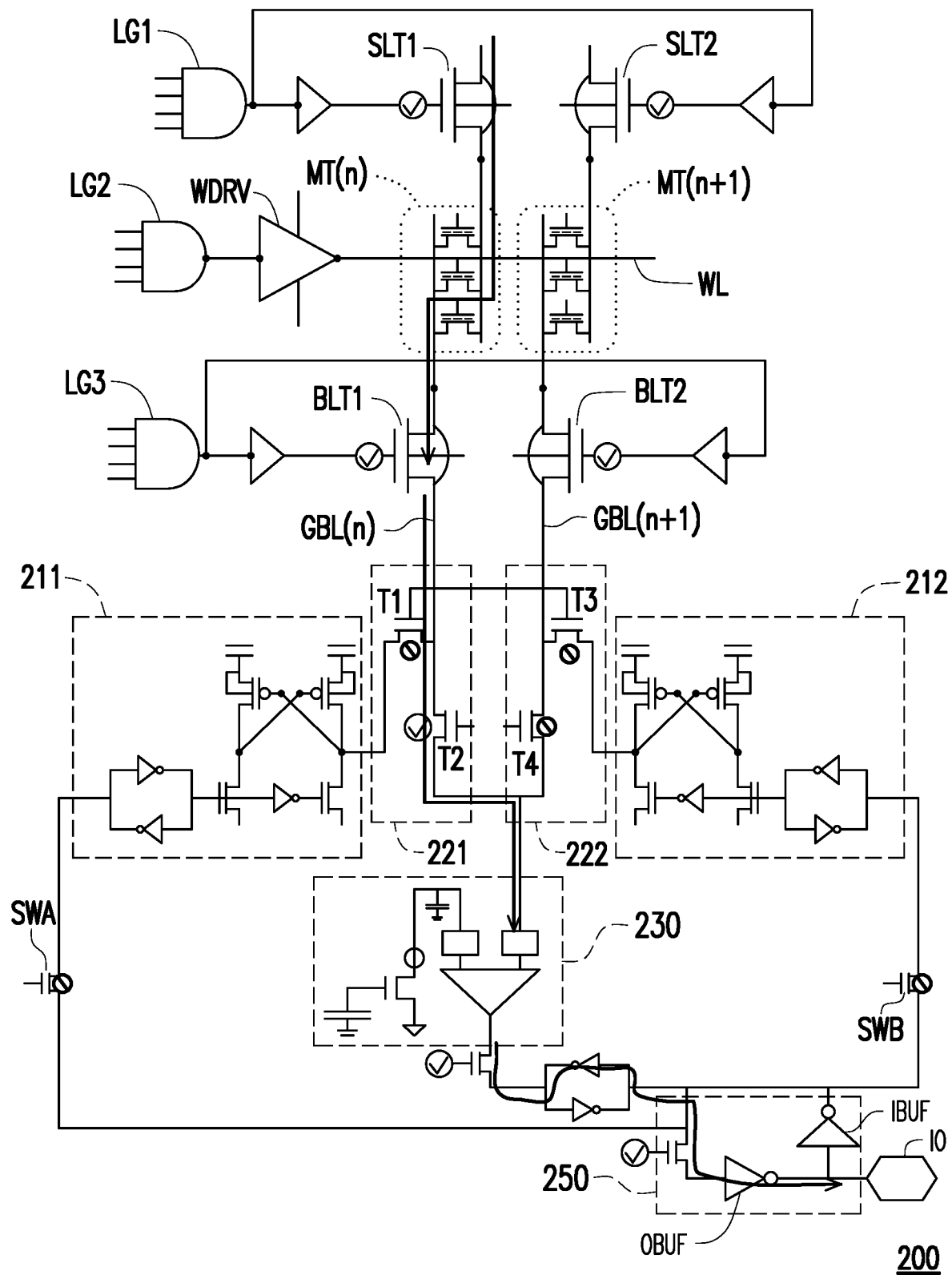
FIG. 7A to FIG. 7B are schematic diagrams of a data read operation of a three-dimensional memory device according to an embodiment of the disclosure.
Figure 7B:
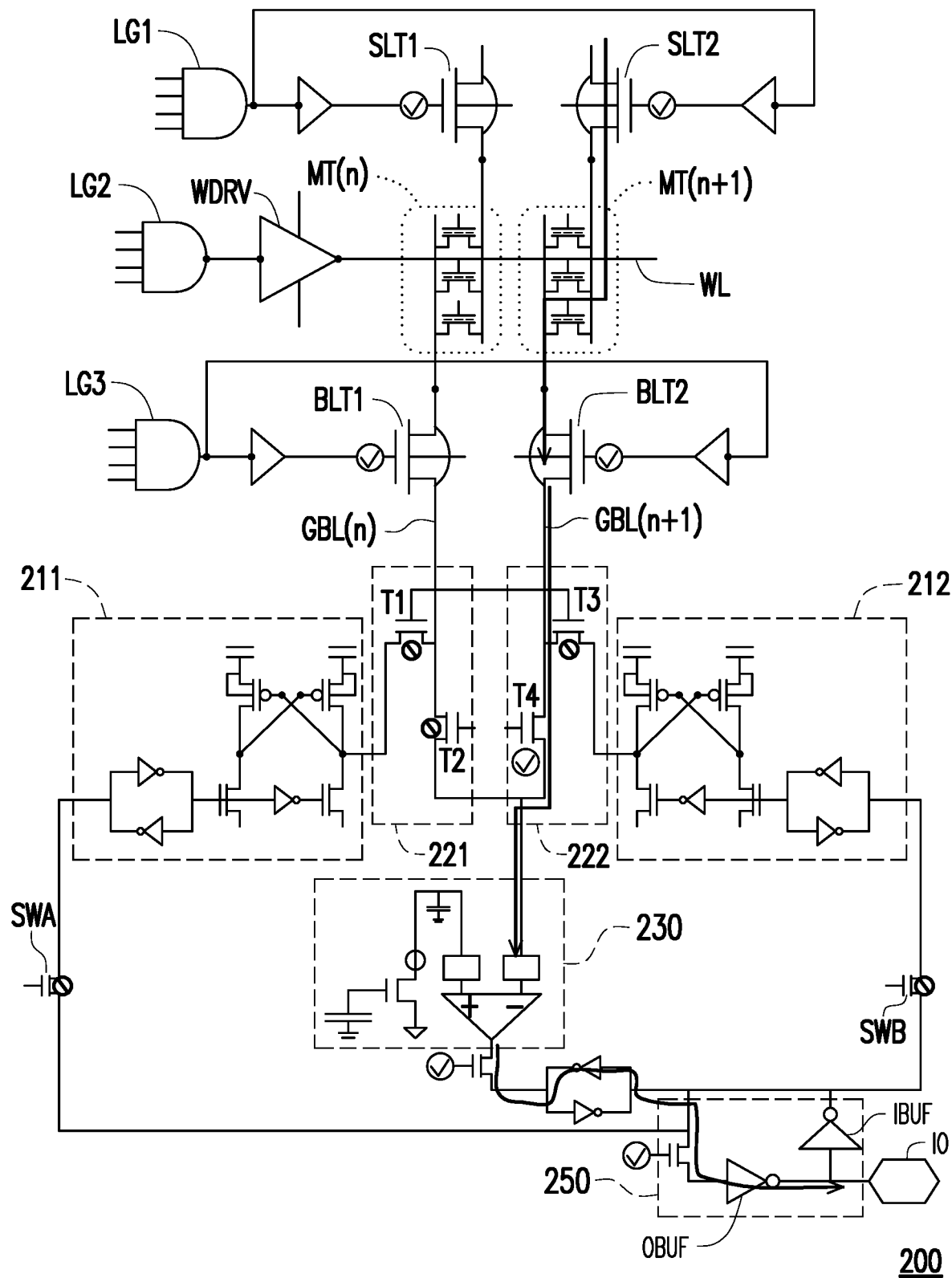

Next, with reference to FIG. 7A to FIG. 7B, FIG. 7A to FIG. 7B are schematic diagrams of a data read operation of a three-dimensional memory device according to an embodiment of the disclosure. Similarly, the circuit architecture of the three-dimensional memory device 200 of FIG. 2 is taken as an example. In FIG. 7A, the switches SWA, SWB are turned off, and the page buffers 211, 212 are non-activated to save power consumption. In addition, the source line switches SLT1, SLT2 and the bit line switches BLT1, BLT2 are respectively turned on according to calculation results of the logic circuits LG1, LG3. Moreover, a bit line WL may be enabled according to the calculation of the logic circuit LG2 and the word line driver WDRV. In the path selector 221, the transistor T2 is turned on, and the transistor T1 is turned off. In the path selector 222, the transistors T3 and T4 are both turned off. Through the turned-on transistor T2, a data transmission path is formed between the source line switch SLT1, a selected memory cell in the memory cell block MT(n), the bit line switch BLT1, and the sense amplifier 230. The sense amplifier 230 may also perform a sensing operation on data provided by the selected memory cell in the memory cell block MT(n) to generate read-out data. The read-out data may be transmitted to the output buffer OBUF in the input and output circuit 250, and output to the input and output port IO.

In addition, in FIG. 7B, unlike in FIG. 7A, the transistors T1 and T2 in the path selector 221 are both turned off, while in the path selector 222, the transistor T3 is in turned off, and the transistor T4 is turned on. Through the turned-on transistor T4, a data transmission path is formed between the source line switch SLT2, a selected memory cell in the memory cell block MT(n+1), the bit line switch BLT2, and the sense amplifier 230. The sense amplifier 230 may also perform a sensing operation on data provided by the selected memory cell in the memory cell block MT (n+1) to generate read-out data. The read-out data may be transmitted to the output buffer OBUF in the input and output circuit 250, and output to the input and output port IO.

From the embodiment of FIG. 7A and FIG. 7B, it may not be difficult to know that, in the three-dimensional memory device 200 of the embodiments of the disclosure, different memory cell blocks MT(n) and MT(n+1) may share the same sense amplifier 230. Moreover, the sense amplifier 230 may perform data read operations sequentially on the global bit line GBL(n) and the global bit line GBL(n+1), which are respectively odd-numbered and even-numbered, for example. In other words, through a mechanism of data read in batches, the power consumption generated at the same time by the data read operation can be effectively reduced.

In summary of the foregoing, the three-dimensional memory device of the disclosure provides the path selectors to selectively couple the global bit lines to the page buffers or to the sense amplifier in different operation modes. The path selectors can provide different paths to cause the three-dimensional memory device to perform a data write operation or a data read operation. The three-dimensional memory device of the disclosure also couples the plurality of global bit lines to the same sense amplifier. The sense amplifier can time-divisionally perform data read operations on the memory cells on different global bit lines, reducing the power consumption generated at the same time by the data read operation.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A three-dimensional memory device, comprising:
   a first page buffer and a second page buffer, respectively configured to temporarily store a first write-in data and a second write-in data;
   a sense amplifier;
   a first path selector, coupled between a first global bit line, the sense amplifier, and the first page buffer, and coupling the sense amplifier or the first page buffer to the first global bit line according to a first control signal; and
   a second path selector, coupled between a second global bit line, the sense amplifier, and the second page buffer, and coupling the sense amplifier or the second page buffer to the second global bit line according to a second control signal,
   wherein the first global bit line is coupled to a first memory cell block, and the second global bit line is coupled to a second memory cell block, and the first memory cell block is different from the second memory cell block.

2. The three-dimensional memory device as described in claim 1, wherein in a write mode, the first path selector couples the first page buffer to the first global bit line according to the first control signal, the second path selector couples the second page buffer to the second global bit line according to the second control signal, the first page buffer provides the first write-in data to the first global bit line, and the second page buffer provides the second write-in data to the second global bit line.

3. The three-dimensional memory device as described in claim 2, wherein when the write mode is a programming mode, the first write-in data is a programming voltage and is configured to perform a programming operation through Fowler-Nordheim tunneling on a selected memory cell corresponding to the first global bit line, and the second write-in data is a programming inhibiting voltage and is configured to perform a programming inhibiting operation on an inhibited memory cell corresponding to the second global bit line.

4. The three-dimensional memory device as described in claim 2, wherein when the write mode is a sector erase mode, each of the first page buffer and the second page buffer provides an erase voltage to perform an erase operation on a plurality of selected memory cells corresponding to the first global bit line and the second global bit line.

5. The three-dimensional memory device as described in claim 2, wherein when the write mode is a byte erase mode, the first page buffer provides an erase inhibiting voltage to perform an erase inhibiting operation on an inhibited memory cell corresponding to the first global bit line, and the second page buffer provides an erase voltage to perform an erase operation on a selected memory cell corresponding to the second global bit line.

6. The three-dimensional memory device as described in claim 1, wherein in a read mode, the first path selector couples the sense amplifier to the first global bit line according to the first control signal, the second path selector couples the sense amplifier to the second global bit line according to the second control signal, and the sense amplifier time-divisionally senses data on the first global bit line and the second global bit line to generate a plurality of read-out data.

7. The three-dimensional memory device as described in claim 1, further comprising:
   a control signal generator, coupled to the first path selector and the second path selector, and generating the first control signal and the second control signal according to an operation mode of the three-dimensional memory device.

8. The three-dimensional memory device as described in claim 1, wherein the first path selector comprises:
   a first switch, coupled between the first global bit line and the first page buffer; and
   a second switch, coupled between the first global bit line and the sense amplifier; and
   wherein the second path selector comprises:
   a third switch, coupled between the second global bit line and the second page buffer; and
   a fourth switch, coupled between the second global bit line and the sense amplifier.

9. The three-dimensional memory device as described in claim 1, further comprising:
   an input and output circuit coupled to the sense amplifier, the first page buffer, and the second page buffer, and being configured to respectively provide the first write-in data and the second write-in data to the first page buffer and the second page buffer in a write mode, and to receive read-out data generated by the sense amplifier in a read mode.

10. The three-dimensional memory device as described in claim 1, further comprising:
    the first memory cell block coupled to the first global bit line through a plurality of first bit line switches; and
    the second memory cell block coupled to the second global bit line through a plurality of second bit line switches.

11. The three-dimensional memory device as described in claim 10, wherein the first memory cell block receives a source line voltage through a plurality of first source line switches, and the second memory cell block receives the source line voltage through a plurality of second source line switches.

12. The three-dimensional memory device as described in claim 11, wherein in a read mode, each of the first bit line switches and each of the corresponding first source line switches are sequentially turned on, and each of the second bit line switches and each of the corresponding second source line switches are sequentially turned on.

13. The three-dimensional memory device as described in claim 11, wherein in a sector erase mode, the first bit line switches, the first source line switches, the second bit line switches, and the second source line switches are turned on.

14. The three-dimensional memory device as described in claim 11, wherein in a byte erase mode, one of the first bit line switches is turned on and the corresponding first source line switch is turned off, and one of the second bit line switches is turned on and the corresponding second source line switch is turned off.

15. The three-dimensional memory device as described in claim 10, wherein the first memory cell block and the second memory cell block are three-dimensional AND flash memory cell blocks.

16. The three-dimensional memory device as described in claim 1, wherein each of the first page buffer and the second page buffer comprises:
    a latch, configured to latch a buffer data; and
    a level shifter, coupled to the latch and shifting a voltage of the buffer data to generate the first write-in data or the second write-in data.

* * * * *